(12) United States Patent
Weimer

(10) Patent No.: US 6,998,675 B2
(45) Date of Patent: *Feb. 14, 2006

(54) NUCLEATION FOR IMPROVED FLASH ERASE CHARACTERISTICS

(75) Inventor: Ronald A. Weimer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/871,918

(22) Filed: Jun. 18, 2004

(65) Prior Publication Data

US 2004/0229433 A1 Nov. 18, 2004

Related U.S. Application Data

(63) Continuation of application No. 10/212,937, filed on Aug. 5, 2002, now Pat. No. 6,762,451, which is a continuation of application No. 09/639,580, filed on Aug. 14, 2000, now Pat. No. 6,455,372.

(51) Int. Cl.
*H01L 29/788* (2006.01)

(52) U.S. Cl. .................................................. 257/321

(58) Field of Classification Search ................ 257/315, 257/316, 317, 321; 438/257, 260, 264, 593, 438/594, 964
See application file for complete search history.

(56) References Cited

U.S. PATENT DOCUMENTS

| | | | |
|---|---|---|---|
| 4,742,020 A | 5/1988 | Roy | |
| 5,102,832 A | 4/1992 | Tuttle | |
| 5,112,773 A | 5/1992 | Tuttle | |
| 5,320,880 A | 6/1994 | Sandhu et al. | |
| 5,340,765 A | 8/1994 | Dennison et al. | |
| 5,366,917 A | 11/1994 | Watanabe et al. | |
| 5,385,863 A | 1/1995 | Tatsumi et al. | |
| 5,445,982 A | 8/1995 | Hwang | |
| 5,885,884 A | 3/1999 | Jan et al. | |
| 5,888,295 A | 3/1999 | Sandhu et al. | |
| 5,914,896 A | 6/1999 | Lee et al. | |
| 5,943,571 A | 8/1999 | Schaefer et al. | |
| 5,953,254 A | 9/1999 | Pourkeramati | |
| 6,043,124 A * | 3/2000 | Wu ............................. 438/260 |

(Continued)

OTHER PUBLICATIONS

Sakai, Akira, et al., *Novel seeding method for the growth of polycrystalline Si films with hemispherical grains*, Applied Physics Letters, vol. 61, No. 2, Jul. 13, 1992, pp. 159-161.

(Continued)

*Primary Examiner*—Matthew Smith
*Assistant Examiner*—Lex H. Malsawma
(74) *Attorney, Agent, or Firm*—Knobbe, Martens, Olson & Bear, LLP

(57) ABSTRACT

The present invention provides a method for improving the erase speed and the uniformity of erase characteristics in erasable programmable read-only memories. This result is achieved by forming polycrystalline floating gate layers with optimized grain size on a tunnel dielectric layer. Nucleation sites are formed by exposing the tunnel dielectric layer to a first set of conditions including a first temperature and a first atmosphere selected to optimize nucleation site size and distribution density across the tunnel dielectric layer. A polycrystalline floating gate layer is formed on top of the nucleation sites by exposing the nucleation sites to a second set of conditions including a second temperature and a second atmosphere selected to optimize polycrystalline grain size and distribution density across the polycrystalline floating gate layer.

19 Claims, 3 Drawing Sheets

U.S. PATENT DOCUMENTS

| | | |
|---|---|---|
| 6,090,666 A | 7/2000 | Ueda et al. |
| 6,194,292 B1 | 2/2001 | Tsu et al. |
| 6,287,915 B1 * | 9/2001 | Muramatsu ................. 438/257 |
| 6,297,095 B1 | 10/2001 | Muralidhar et al. |
| 6,762,451 B1 * | 7/2004 | Weimer ...................... 257/315 |
| 6,791,141 B1 * | 9/2004 | Keller et al. ................ 257/316 |

OTHER PUBLICATIONS

Watanabe, et al., *Hemispherical Grained Si Formation on in-situ Phosphorus Doped Amorphous-Si Electrode for 256Mb DRAM's Capacitor, IEEE Transactions on Electron Devices*, vol. 42, No. 7, Jul. 1995, pp. 1247-1254.

* cited by examiner

NUCLEATION FOR IMPROVED FLASH ERASE CHARACTERISTICS

CLAIM OF PRIORITY

This application is a continuation application of, and claims priority from U.S. patent application Ser. No. 10/212,937, filed Aug. 5, 2002 now U.S. Pat. No. 6,762,451, which is incorporated in its entirety by reference herein, and which is a continuation application of, and claims priority from U.S. patent application Ser. No. 09/639,580, filed Aug. 14, 2000, issued as U.S. Pat. No. 6,455,372, Sep. 24, 2002, which is incorporated in its entirety by reference herein.

FIELD OF THE INVENTION

The present invention generally relates to tailoring transistor gate electrode crystal morphology for the formation of integrated circuits. More particularly, the invention relates to processes and structures for improving the erase speed and the uniformity of erase characteristics in erasable programmable read-only memories (EEPROMs).

BACKGROUND OF THE INVENTION

Memory devices such as erasable programmable read-only memories (EPROMs), electrically erasable programmable read-only memories (EEPROMs), or flash erasable programmable read-only memories (FEPROMs) are erasable and reusable memory cells which are used in digital cellular phones, digital cameras, LAN switches, cards for notebook computers, etc. A memory cell operates by storing electric charge (representing an "on" state) on an electrically isolated floating gate, which is incorporated into a transistor. This stored charge affects the behavior of the transistor, thereby providing a way to read the memory element. The switching speed of such a memory cell for converting from an "on" state to an "off" state is limited in part by the speed of charge dissipation from the floating gate (i.e., the erase speed). Because faster erase speeds equate to faster switching speeds, efforts have been made to increase the erase speeds of such memory devices, as well as to improve the erase uniformity among the memory cells.

A flash memory cell typically consists of a transistor, a floating gate, and a control gate above the floating gate in a stacked gate structure. The floating gate, typically composed of polycrystalline silicon (i.e., "polysilicon"), is electrically isolated from the underlying semiconductor substrate by a thin dielectric layer, which is typically formed of silicon oxide. Because charge is transferred across the dielectric layer by quantum-mechanical tunneling, this dielectric layer is often referred to as a "tunnel oxide" layer. Such tunnel oxide layers are typically approximately 100 Å thick. Properties of the tunnel oxide must be strictly controlled to ensure the ability to read and write by tunneling, while avoiding data loss through charge trapping or leakage. The control gate is positioned above the floating gate, and is electrically isolated from the floating gate by a storage dielectric layer, such as oxide-nitride-oxide (ONO). Electrical access to the floating gate is therefore only through capacitors.

Storing charge on the floating gate programs a memory cell. This is achieved via hot-electron injection by applying a high positive voltage (approximately 12 V) to the control gate, and a high drain-to-source bias voltage (approximately 6 V). An inversion region is created between the source and drain by the control gate voltage, and electrons are accelerated from the source to the drain by the drain bias voltage. Some fraction of these electrons will have sufficient energy to surmount the tunnel oxide barrier height and reach the floating gate. The floating gate is therefore programmed by collecting and storing these electrons to represent an "on" state.

An EPROM device can be erased (i.e., returned to an "off" state) by exposing the floating gate to ultraviolet light, which excites the stored electrons out of the floating gate. The erasure of an EEPROM or FEPROM cell is accomplished via Fowler-Nordheim tunneling, in which applying an electric field, which is sufficient for the stored electrons to traverse the tunnel oxide and enter the substrate, reduces the stored charge in the floating gate. Under this mechanism for discharging the floating gate, a large negative voltage (e.g., −10 V) is applied to the control gate, and a positive voltage (e.g., 5–6 V) is applied to the source while the drain is left floating. Electrons then tunnel from the floating gate through the tunnel oxide, and are accelerated into the source. Because both the programming and erasing of a memory element takes place via charge transfer processes across the tunnel oxide layer, it is important to minimize the defect density in this region that would otherwise create a mechanism for charge trapping or leakage through the tunnel oxide.

A variety of efforts have been aimed at improving the quality of the tunnel oxide and the floating gate for reliable and uniform write and erase characteristics. As critical dimensions continue to shrink, however, maintaining reliability and uniformity while increasing operating speed becomes ever more challenging.

Accordingly, a need exists for improved flash memory device structures and methods of fabrication.

SUMMARY OF THE INVENTION

In accordance with one aspect of the present invention, a method of tailoring the crystal morphology of a polysilicon floating gate layer in a flash memory device is provided. The method includes forming a tunnel dielectric layer, and forming nucleation sites on top of the tunnel dielectric layer under a first set of conditions comprising a first temperature and a first atmosphere. A polysilicon layer is formed on top of the nucleation sites under a second set of conditions different from the first set of conditions, the second set of conditions comprising a second temperature and a second atmosphere.

In accordance with another aspect of the invention, a method of tailoring the erase speed and erase uniformity of a flash memory device is provided. The method includes forming a tunnel dielectric layer and forming a polysilicon floating gate layer on the tunnel dielectric layer. The polysilicon floating gate layer has tailored polysilicon grain sizes.

In accordance with yet another aspect of the present invention, a method of tailoring the crystal morphology of a crystalline transistor electrode in an integrated circuit is provided. The method includes forming a dielectric layer, and forming nucleation sites on top of the dielectric layer by exposing the dielectric layer to a first set of deposition conditions selected to optimize grain density. A polycrystalline layer is formed on top of the nucleation sites by exposing the nucleation sites to a second set of deposition conditions selected to optimize grain size.

In accordance with yet another aspect of the present invention, a polysilicon floating gate layer in a flash memory device is provided. The polysilicon floating gate layer is formed by forming a tunnel dielectric layer, and forming nucleation sites on top of the tunnel dielectric layer under a first set of conditions comprising a first temperature and a first atmosphere. A polysilicon layer is formed on top of the nucleation sites under a second set of conditions different from the first set of conditions, the second set of conditions comprising a second temperature and a second atmosphere.

In the illustrated embodiments, the crystal morphology of a polysilicon floating gate layer in a flash memory cell is tailored for faster erase speed and more uniform erase characteristics. Advantageously, by separating the nucleation and growth of the polysilicon floating gate layer, the crystal structure and distribution density of the nucleation sites can be selected independently of the polysilicon crystal growth. In this way, the distribution density and grain size of the polysilicon layer can be optimized to produce polysilicon floating gate layers with faster erase speeds and more uniform erase characteristics.

DETAILED DESCRIPTION OF THE PREFERRED EMBODIMENT

While illustrated in the context of an electrically erasable programmable read only memory (EEPROM) device for flash memory circuits, persons skilled in the art will readily find application for the present invention to fabrication of other semiconductor integrated circuit devices. In particular, methods disclosed herein are applicable to improving the charge transfer characteristics of polysilicon layers in a wide variety of transistor designs with a wide variety of process flows. The methods described herein, however, have particular utility for improving the performance of polysilicon floating gate layers in flash memory devices.

Erase speed of the floating gate is a limitation of the ultimate switching speed of memory cells produced by current flash technology. This erase speed is controlled to a large degree by the crystal morphology of the floating gate formed on top of the tunnel oxide. For example, a polycrystalline silicon (i.e., polysilicon) floating gate layer has been shown to have a faster erase speed than an amorphous silicon layer, due to the enhanced charge transport and dissipation along the grain boundaries of the polysilicon layer. However, for a polysilicon layer with very large grains and dispersed grain boundaries (e.g., formed by the crystallization of a previously deposited amorphous silicon layer), the erase speed of a given memory cell is non-uniform across the floating gate layer. Devices with lower numbers of grains and grain boundaries have per cell slower erase speeds than devices with higher numbers of grains and grain boundaries per cell. In addition, different memory cells across one array may have different erase characteristics due to the varying grain structures from one cell to another. Too great a variation in erase characteristics from one cell to another can result in overerase of some cells, whereby the floating gate voltage is lowered so much that the next write cycle cannot provide enough charge to read the cell as being in a charged or "1" state.

These non-uniformities will become even more pronounced and important in future generations of flash memory devices as the sizes of memory cells are reduced. It is therefore advantageous to design the crystal morphology of the polysilicon floating gate to provide faster erase speeds and improve erase uniformity among the fabricated memory cells. This result is achieved in the illustrated embodiment by forming polysilicon floating gate layers with smaller grain sizes, which have correspondingly more numerous grain boundaries, thereby ensuring a faster and more uniform erase.

Figure 1:
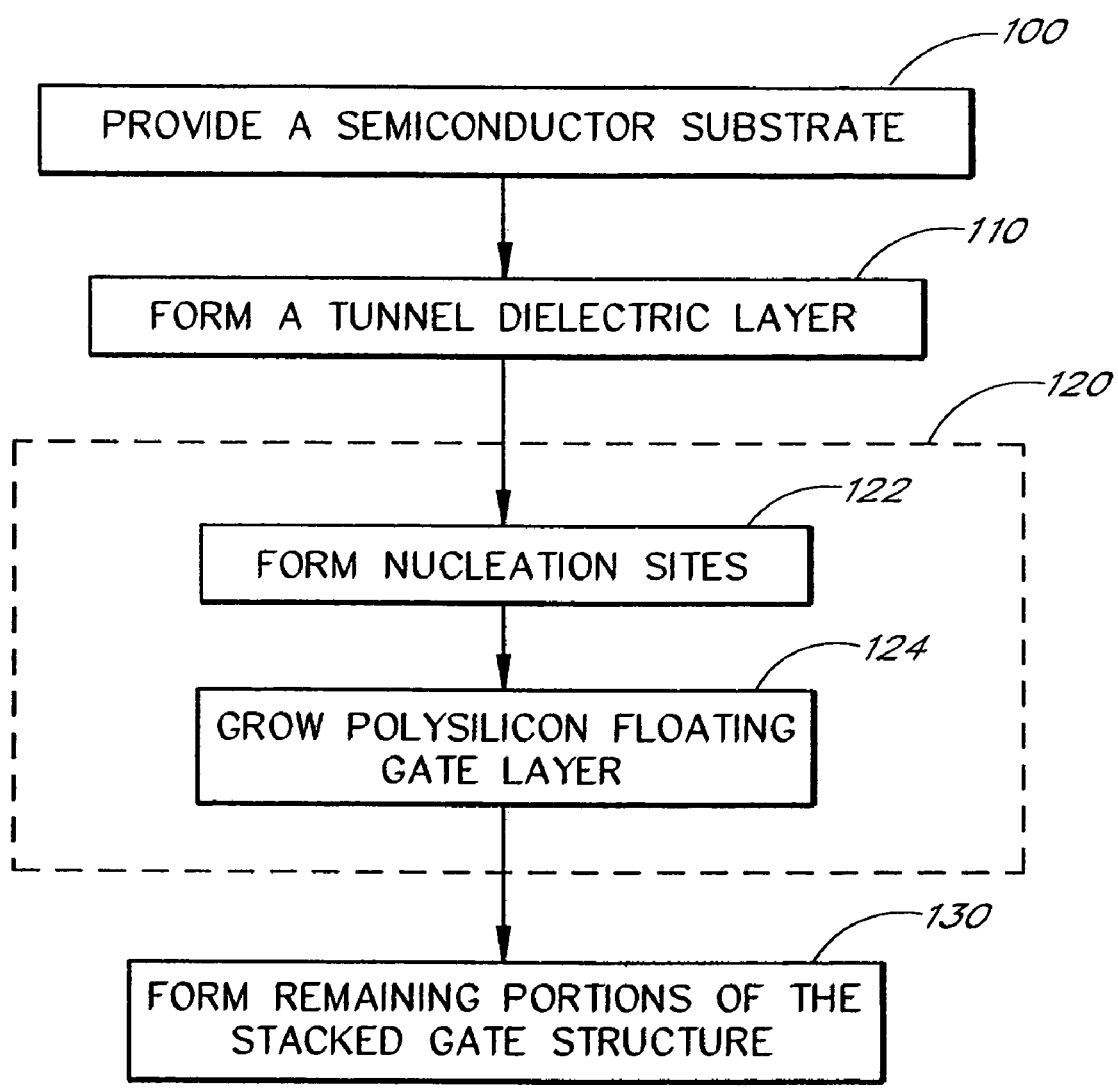
FIG. 1 is a flow chart, generally illustrating a process flow in accordance with a preferred embodiment of the present invention.
Figure 2A:
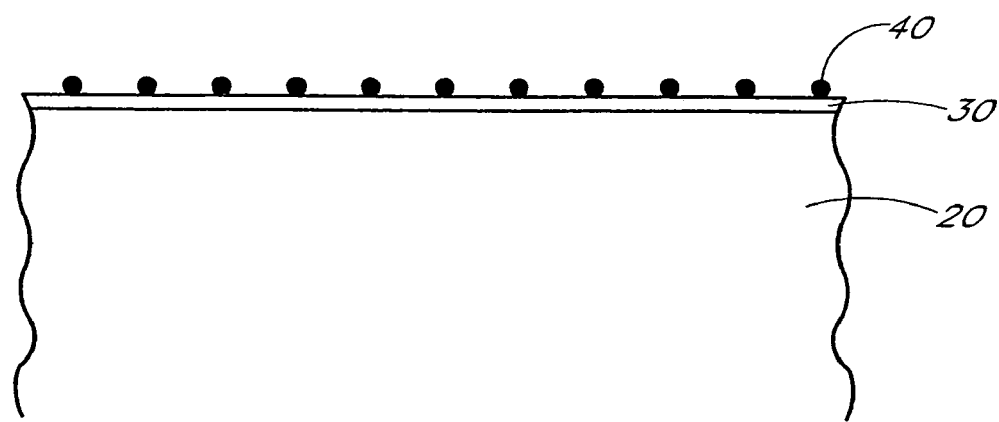
FIG. 2A schematically illustrates a gate dielectric layer having nucleation sites formed thereover, in accordance with the preferred embodiment of the present invention.
Figure 2B:
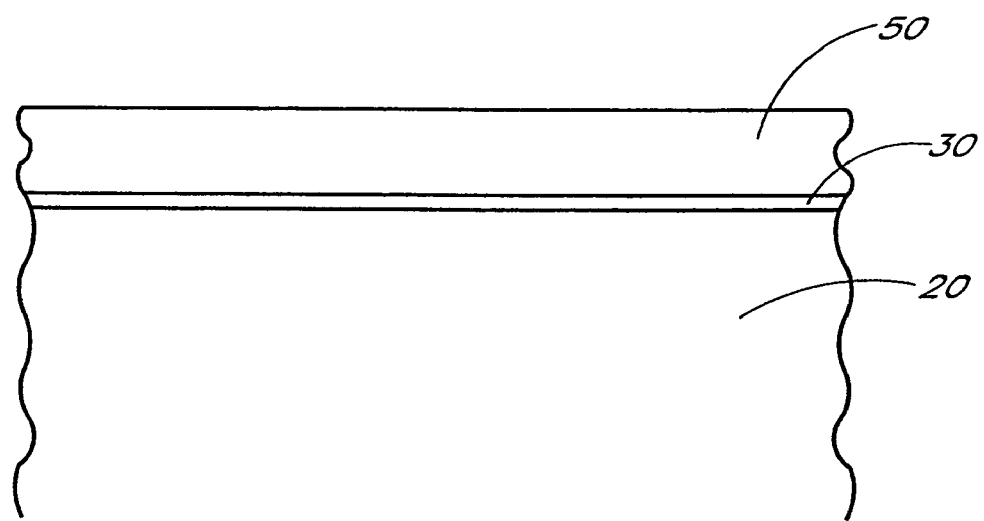
FIG. 2B illustrates the structure of FIG. 2A after formation of a polysilicon layer over the nucleation sites.
Figure 3:
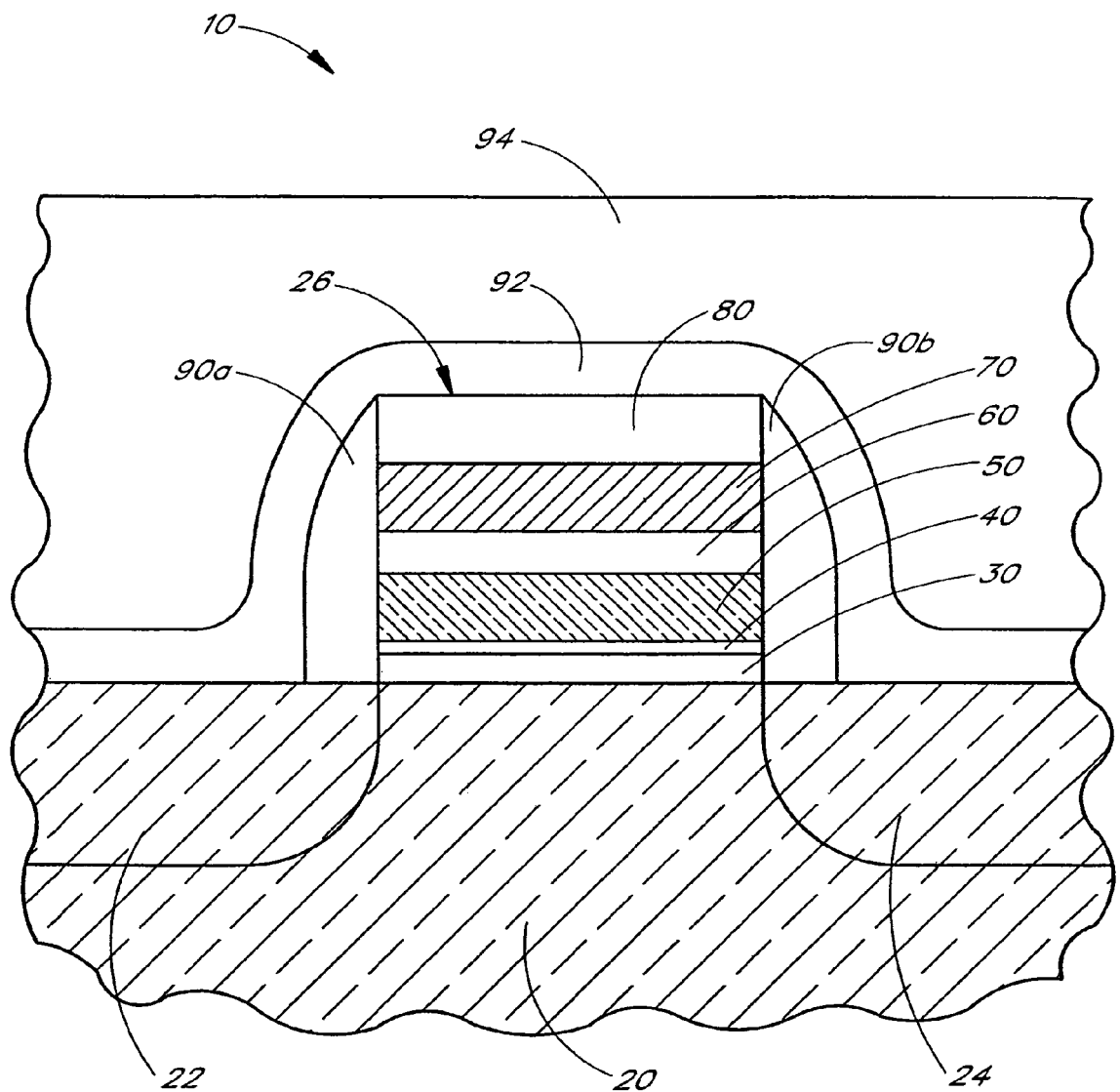
FIG. 3 illustrates a completed EEPROM device structure, constructed in accordance with the preferred embodiment of the present invention.

FIG. 1 is a flow chart which generally illustrates a process flow in accordance with one preferred embodiment of the present invention, FIGS. 2A and 2B illustrate the device structure corresponding to two stages of the floating gate formation, and FIG. 3 illustrates a completed flash memory device. In the following description of the preferred embodiments, the named process flow steps are found in FIG. 1 and the numbered structural elements refer to FIGS. 2A, 2B, and 3. It will be understood, however, that elements may differ in appearance during fabrication as compared to the illustrated final structure. For example, while the stacked gate layers described below can be completed in any suitable fashion, typically entailing numerous processing steps, they are preferably blanket deposited upon one another prior to patterning of the gate electrode by photolithography and etch.

The EEPROM transistor 10 produced by the preferred embodiment of the present invention is fabricated over a semiconductor substrate 20, which includes doped regions defining transistor active areas. FIG. 1 includes providing 100 such a semiconductor substrate 20. In the illustrated embodiment, the substrate 20 comprises the upper portion of a single-crystal silicon wafer. In general, however, the substrate can comprise any semiconductor structure or layer in which the lowest level of integrated electrical devices are formed.

In the preferred embodiment of the present invention, the fabrication of the stacked gate structure begins with the formation 110 of a tunnel dielectric layer 30 on the surface of the substrate 20. The tunnel dielectric layer 30 of the illustrated embodiment comprises an oxide, and more particularly silicon dioxide, though the skilled artisan will appreciate that the present invention will have utility in conjunction with other types of dielectrics. An exemplary alternative oxide comprises tantalum pentoxide ($Ta_2O_5$). In the illustrated embodiment, formation 110 of the tunnel dielectric layer 30 comprises thermal oxidation of the substrate surface, but persons skilled in the art are able to select an appropriate method of forming the tunnel dielectric layer 30 from the various possible methods. The thickness of the illustrated tunnel dielectric layer 30 at this stage in the fabrication of the stacked gate structure 26 is typically between approximately 90 Å and 110 Å for a state-of-the-art flash memory cell.

In the illustrated embodiment, formation 120 of a floating gate 50 on top of the tunnel dielectric layer 30 is achieved by a process comprising a nucleation 122 and a bulk growth 124. The nucleation 122 comprises exposing the tunnel dielectric layer 30 to a first set of conditions comprising a first temperature and a first atmosphere. During the nucleation 122, nucleation sites 40 (FIG. 2A) are formed on the tunnel dielectric layer 30 for subsequent polysilicon growth.

The preferred embodiment of the present invention utilizes a first atmosphere comprising a first hydride species which includes, but is not limited to, silane ($SiH_4$) or disilane ($Si_2H_6$). Persons skilled in the art are able to select an appropriate first hydride species compatible with the present invention.

It has previously been shown that hemispherically-grained polycrystalline Si (HSG-Si) films can be fabricated on dielectric layers by first seeding an amorphaus silicon layer prior to polysilicon annealing. For example, U.S. Pat. Nos. 5,102,832 and 5,112,773 issued to Tuttle, which are incorporated by reference herein, disclose the formation of texturized polysilicon by first sprinkling extremely small particles approximately 30 Å to 300 Å in diameter or by depositing polysilicon nodules by chemical vapor deposition. These particles or nodules then serve as nucleation sites for subsequent HSG silicon growth. In these applications, the goal has been to form texturized HSG-Si layers with increased surface area, as compared to flat polysilicon layers. Therefore, the nucleation sites for the creation of HSG-Si films are spaced sufficiently apart to yield a highly texturized polysilicon layer. Conversely, in the preferred embodiment of the present invention, relatively flat polysilicon layers with small grain sizes are desired, thereby requiring different process parameters than the formation of HSG-Si films. Furthermore, polysilicon is seeded and formed over oxide or other dielectric, in contrast to HSG-Si; which is formed over polysilicon, and typically selectively formed to avoid seeding and deposition on adjacent insulating features.

Both the first temperature and first hydride species partial pressure (or alternatively, the first hydride species flow rate) influence the distribution density of nucleation sites 40 across the surface of the tunnel dielectric layer 30. However, since the first temperature also influences the grain structure of the nucleation sites 40, the preferred embodiment of the present invention selects the first temperature to optimize the grain structure of the nucleation sites 40, and selects the partial pressure of the first hydride species to optimize the distribution density of nucleation sites 40 across the surface of the tunnel dielectric layer 30.

If the first temperature is too low, then the resulting nucleation sites 40 are amorphous and the distribution density of nucleation sites 40 is high. And if the first temperature is too high, the resulting nucleation sites 40 are polycrystalline. The temperature during the nucleation 122 of the preferred embodiment is preferably between approximately 500° C. and 650° C., more preferably between approximately 575° C. and 630° C.

In the preferred embodiment of the present invention, the partial pressure of the first hydride species during the nucleation 122 is selected to provide sufficient flux of the first hydride species to the surface of the tunnel dielectric layer 30 to form a film of non-continuous nucleation sites 40, without the growth of bulk silicon. While the total pressure of the first atmosphere of the nucleation 122 is dependent in part on the deposition tool being used, the preferred ranges of partial pressures of the first hydride species are not dependent on the deposition tool being used.

For single-wafer chambers, which are typically capable of achieving extremely low pressures, the total pressure of the first atmosphere of the nucleation 122 is substantially equal to the first hydride species partial pressure, which is preferably between approximately $10^{-7}$ Torr and $10^{-2}$ Torr, more preferably between approximately $10^{-7}$ Torr and $10^{-3}$ Torr, and most preferably between approximately $10^{-5}$ Torr and $10^{-3}$ Torr. In a typical single wafer tool, a corresponding gas flow rate of the first hydride species is preferably between approximately 1 sccm and 100 sccm, and more preferably between approximately 10 sccm and 30 sccm.

For multi-wafer chambers (e.g., batch furnaces), which are typically not capable of achieving total pressures below approximately 100 mTorr, the same above-described first hydride species are used, with the remainder of the first atmosphere comprising inert gases such as Ar, Ne, He, or $N_2$. The corresponding gas partial pressure of the first hydride species is preferably between approximately 1 mTorr and 100 mTorr, more preferably between approximately 10 mTorr and 50 mTorr.

The above ranges of first hydride species partial pressures and gas flow rates of the first atmosphere are substantially reduced from those values typically used to grow bulk polysilicon films using the conventional techniques.

The exposure time of the tunnel dielectric layer 30 to the first atmosphere to achieve sufficient nucleation sites 40 is dependent, in part, on the first temperature, first hydride species partial pressure, and gas flow rate of the first atmosphere. For the above-described ranges of these values for single-wafer chambers, the exposure time is preferably between approximately 10 seconds and 3 minutes, more preferably between approximately 30 seconds and 90 seconds. For batch systems, the exposure time is preferably between approximately 5 minutes and 60 minutes, and more preferably between approximately 10 minutes and 30 minutes.

The resultant distribution density of nucleation sites 40 across the tunnel dielectric layer 30 is preferably between approximately $5/\mu m^2$ and $100/\mu m^2$, more preferably between approximately $20/\mu m^2$ and $80/\mu m^2$, and most preferably between approximately $30\,\mu m^2$ and $60\,\mu m^2$. In other arrangements, persons skilled in the art will be able to select an appropriate set of values for the first temperature, first hydride species partial pressures, gas flow rates, and exposure time to produce sufficient nucleation sites 40 on the surface of the tunnel dielectric layer 30 in view of the disclosure herein.

Once the tunnel dielectric layer 30 has been exposed to the first hydride species in the nucleation 122 to form the optimal size and distribution density of nucleation sites 40, the bulk polysilicon growth 124 comprises exposing the nucleation sites 40 to a second temperature and a second atmosphere to provide the bulk deposition of a continuous polysilicon layer on top of the nucleation sites 40 for the floating gate 50. The growth 124 of the preferred embodiment is performed in situ (i.e., without removing the substrate 20 from the chamber in which the nucleation 122 is performed). More preferably, the transition from nucleation 122 to growth 124 is continuous. Accordingly in the preferred embodiment, the second atmosphere during the growth 124 preferably comprises a second hydride species which is the same as the first hydride species used during the nucleation 122. Other embodiments of the present invention, however, place the substrate 20 into another chamber to perform the growth 124 ex situ.

In the preferred embodiment of the present invention, the second temperature and the partial pressure of the second hydride species of the second atmosphere during the growth 124 are selected to provide sufficient flux of the second hydride species to the surface of the tunnel dielectric layer 30 to form a continuous polysilicon layer optimized for the desired dopant profile and crystal morphology. For low second temperatures, the resulting silicon film tends to be amorphous, with a high incorporation of dopants. For higher second temperatures, the resulting silicon film is more polycrystalline, with less incorporation of dopants. The second temperature during the growth 124 of the preferred embodiment is preferably between approximately 450° C. and 700° C., more preferably between approximately 500° C. and 700° C., and most preferably between approximately 530° C. and 650° C.

While the total pressure of the second atmosphere of the growth 124 is dependent in part on the deposition tool being used, the preferred ranges of partial pressure of the second hydride species are not dependent on the deposition tool being used. For single-wafer chambers, the total pressure of the second atmosphere of the growth 124 is substantially equal to the second hydride species partial pressure plus the partial pressure of the dopant gas. The dopant gas can be selected from known sources for boron, phosphorous, arsenic, etc. The second hydride species partial pressure is preferably between approximately 0.1 Torr and 10 Torr. For multi-wafer chambers, the same above-described second hydride species and dopant gas are used as in the nucleation 122, with the remainder of the second atmosphere comprising inert gases such as Ar, Ne, He, or $N_2$. In general, conditions for bulk poly or amorphous silicon deposition are well known for both single wafer and batch systems.

The exposure time of the tunnel dielectric layer 30 to the second atmosphere to achieve sufficient polysilicon layer growth is dependent, in part, on the second temperature, second hydride species partial pressure, and gas flow rate of the second atmosphere. For the above-described ranges of these values for single-wafer chambers, the exposure time is preferably between approximately 1 second and 10 minutes, more preferably between approximately 1 and 5 minutes. For batch systems, the exposure time is preferably between approximately 1 min. and 60 min., more preferably between approximately 10 minutes and 45 minutes. In other arrangements, persons skilled in the art will be able to select an appropriate set of values for the second temperature, second hydride species partial pressure, gas flow rate, and exposure time to produce sufficient polysilicon layer growth on top of the nucleation sites 40.

As a result, the average polysilicon grain sizes are preferably between approximately 25 Å and 500 Å.

Erase speeds of the resulting flash memory devices are preferably between approximately 100 $\mu$-sec and 100 m-sec, more preferably between approximately 100 $\mu$-sec and 1 mSec, and most preferably between approximately 150 $\mu$-sec and 199 $\mu$-sec. Erase uniformity of the resulting flash memory devices, measured by repair density for column erase, is thereby improved. Persons skilled in the art will be able to select appropriate polysilicon grain sizes and grain densities for creating flash memory devices with particular characteristics, including erase speed and erase uniformity.

In the preferred embodiment, the doping of the floating gate 50 is in situ (i.e., while the floating gate 50 is being formed). In other embodiments consistent with the present invention, the doping is performed ex situ after the polysilicon deposition. Persons skilled in the art are able to select appropriate doping methods for creating the floating gate 50 with a particular set of characteristics.

By separating the formation 120 of the floating gate 50 into a nucleation 122 and a growth 124, the distribution density of nucleation sites 40 can be selected independently of the polysilicon growth conditions. In this way, the polysilicon nucleation distribution density and grain size can be optimized independently.

In some embodiments of the present invention, the transition from the nucleation 122 to the growth 124 is abrupt and non-continuous, depending upon the response time of the temperature control systems. Typically, single wafer systems are capable of more rapid temperature ramping, resulting in an abrupt transition from nucleation to bulk growth.

With reference to FIG. 3, the formation 130 of the remaining portions of the stacked gate structure 26 continues by the formation of a storage dielectric layer 60 on the floating gate 50. In the illustrated embodiment, the storage dielectric layer 60 is composed of oxide-nitride-oxide (ONO). The formation of this storage dielectric layer 60 in the illustrated embodiment is performed by methods known in the art. In other embodiments of the present invention, high dielectric materials may be employed in the storage dielectric layer 60 to improve the capacitance of the EEPROM device. Persons skilled in the art can readily select appropriate materials and methods for creating the storage dielectric layer 60 for particular circuit designs.

The formation of the stacked gate structure 26 of the illustrated embodiment then continues by the formation of a control gate 70 over the storage dielectric layer 60. In the illustrated embodiment, the control gate 70 is composed of polysilicon, however, in other embodiments the control gate 70 can be composed of various other conductive materials, including, but not limited to, metal and/or metal silicide. Upon formation of the control gate 70, a cap insulator layer 80 is preferably formed, comprising an insulator such as silicon nitride or silicon oxide, over the control gate 70.

Upon patterning, such as by conventional photolithography and etch processes, the stacked gate structure 26 is defined, as illustrated in FIG. 3. Spacers 90a and 90b are formed along the sidewalls of the stacked gate structure 26. Conventional blanket deposition of an insulating material followed by a directional spacer etch can be employed for spacer formation.

The stacked gate structure 26 and other surrounding areas are then covered by a substantially conformal liner layer 92. The liner 92 comprises an insulating material, preferably incorporating both silicon and nitrogen. Preferred liner materials include silicon oxide, silicon nitride, silicon oxynitride or a multiple layer laminate including one or both of nitride and oxynitride. The liner 92 can be formed by any suitable manner, but is preferably formed by chemical vapor deposition (CVD) to ensure good step coverage over the topography of the patterned stacked gate structures 26 across the substrate 20.

Subsequent to forming the liner layer 92 in the preferred embodiment of the present invention, an interlevel insulating layer 94 is deposited over the structure. Typically composed of BPSG, the layer 94 serves to electrically isolate underlying devices, such as the EEPROM transistor 10, from overlying interconnects. Accordingly, the interlevel insulating layer 94 is preferably between about 6,000 Å and 20,000 Å in thickness.

After depositing the interlayer insulating layer 94, the integrated circuit is completed by additional fabrication steps. Typically, such steps include metallization processes, interconnecting various devices of the integrated circuit. In order to make contact electrical contact between metal layers and the electronic devices, holes or vias are etched through the interlevel dielectric layers, such as the interlevel insulating layer 94, and then filled with conductive material 96. Contact to the control gate 70 and active areas in the substrate 20, for example, require contact through the interlevel insulating layer 94 and the liner layer 92.

The integrated circuit is then completed by formation of bond pads and final passivation, such as by deposition of a further silicon oxynitride layer or other suitable passivation material (not shown). As will be appreciated by the skilled artisan, the passivation layer forms a seal against moisture or other corrosive agents.

Although described above in connection with particular embodiments of the present invention, it should be understood the descriptions of the embodiments are illustrative of the invention and are not intended to be limiting. Various modifications and applications may occur to those skilled in the art without departing from the true spirit and scope of the invention as defined in the appended claims.

I claim:

1. A flash memory device comprising:
a tunnel dielectric layer; and
a polysilicon floating gate layer over the tunnel dielectric layer, the polysilicon floating gate layer having polysilicon grain sizes between approximately 25 Å and 500 Å on a distribution density of nucleation sites between approximately 30 per $\mu m^2$ and 60 per $\mu m^2$.

2. A flash memory device comprising:
a tunnel dielectric layer; and
a polysilicon floating gate layer over the tunnel dielectric layer, the polysilicon floating gate layer having polysilicon grain sizes between approximately 25 Å and 500 Å on a distribution density of nucleation sites between approximately 5 per $\mu m^2$ and 100 per $\mu m^2$, wherein the flash memory device has an erase speed between approximately 100 $\mu$-sec and 150 m-sec.

3. The flash memory device of claim 2, wherein the erase speed is between approximately 100 $\mu$-sec and 100 m-sec.

4. The flash memory device of claim 2, wherein the erase speed is between approximately 100 $\mu$-sec and 1 m-sec.

5. A flash memory device comprising:
a tunnel dielectric layer; and
a polysilicon floating gate layer on top of the tunnel dielectric layer, the polysilicon floating gate layer formed by a process comprising:
depositing nucleation sites on top of the tunnel dielectric layer by exposing the tunnel dielectric layer to a first set of deposition conditions; and
depositing the polysilicon floating gate layer on top of the nucleation sites by exposing the nucleation sites to a second set of deposition conditions different from the first set of deposition conditions, the polysilicon floating gate layer having a polysilicon grain density in a range between approximately 5 per $\mu m^2$ and 100 per $\mu m^2$.

6. The flash memory device of claim 5, wherein the polysilicon grain density is between approximately 20 per $\mu m^2$ and 80 per $\mu m^2$.

7. The flash memory device of claim 5, wherein the polysilicon grain density is between approximately 30 per $\mu m^2$ and 60 per $\mu m^2$.

8. The flash memory device of claim 5, wherein the polysilicon floating gate layer has polysilicon grain sizes between approximately 25 Å and 500 Å.

9. The flash memory device of claim 8, wherein the polysilicon grain sizes are between approximately 50 Å and 200 Å.

10. The flash memory device of claim 5, wherein the flash memory device has an erase speed between approximately 100 $\mu$-sec and 150 m-sec.

11. The flash memory device of claim 10, wherein the erase speed is between approximately 100 $\mu$-sec and 100 m-sec.

12. The flash memory device of claim 10, wherein the erase speed is between approximately 100 $\mu$-sec and 1 m-sec.

13. A crystalline transistor electrode having a tailored crystal morphology, the crystalline transistor electrode formed by a method comprising:
forming a dielectric layer;
depositing nucleation sites on top of the dielectric layer by exposing the dielectric layer to a first set of deposition conditions selected to optimize grain density, wherein the grain density is in a range between approximately 5 per $\mu m^2$ and 100 per $\mu m^2$; and
depositing a polycrystalline layer on top of the nucleation sites by exposing the nucleation sites to a second set of deposition conditions.

14. The crystalline transistor electrode of claim 13, wherein the grain density is in a range between approximately 20 per $\mu m^2$ and 80 per $\mu m^2$.

15. The crystalline transistor electrode of claim 13, wherein the grain density is in a range between approximately 30 per $\mu m^2$ and 60 per $\mu m^2$.

16. The crystalline transistor electrode of claim 13, wherein the polycrystalline layer has grain sizes in a range between approximately 50 Å and 200 Å.

17. The crystalline transistor electrode of claim 13, wherein the crystalline transistor electrode has an erase speed between approximately 100 $\mu$-sec and 150 m-sec.

18. The flash memory device of claim 17, wherein the erase speed is between approximately 100 $\mu$-sec and 100 m-sec.

19. The flash memory device of claim 17, wherein the erase speed is between approximately 100 $\mu$-sec and 1 m-sec.

* * * * *

UNITED STATES PATENT AND TRADEMARK OFFICE
CERTIFICATE OF CORRECTION

PATENT NO. : 6,998,675 B2
APPLICATION NO. : 10/871918
DATED : February 14, 2006
INVENTOR(S) : Ronald A. Weimer It is certified that error appears in the above-identified patent and that said Letters Patent is hereby corrected as shown below:

On Page 2, Col. 1 (U.S. Patent Documents), Line 5, after "6,762,451" delete - - B1 - - and insert - - B2 - -.

In Col. 1, Line 8 (approx.), after "2002" insert - - , - - [comma].

In Col. 5, Line 9, delete - - amorphaus - - and insert - - amorphous - -.

In Col. 6, Line 33, delete - - 30 µm² - - and insert - - 30/µm² - -.

In Col. 6, Line 33, delete - - 60 µm² - - and insert - - 60/µm² - -.

In Col. 7, Line 45, delete - - mSec, - - and insert - - m-sec, - -.

In Col. 9, Line 49, delete - - µm$^z$ - - and insert - - µm² - -.

Signed and Sealed this

Eighth Day of August, 2006

JON W. DUDAS
*Director of the United States Patent and Trademark Office*